United States Patent [19]

Shono et al.

[11] Patent Number: 5,329,129
[45] Date of Patent: Jul. 12, 1994

[54] ELECTRON SHOWER APPARATUS INCLUDING FILAMENT CURRENT CONTROL

[75] Inventors: Kazuhiro Shono; Naomitsu Fujishita; Kazuhiko Noguchi; Takahisa Nagayama; Shigeo Sasaki, all of Amagasaki, Japan

[73] Assignee: Mitsubishi Denki Kabushiki Kaisha, Tokyo, Japan

[21] Appl. No.: 849,238

[22] Filed: Mar. 10, 1992

[30] Foreign Application Priority Data

Mar. 13, 1991 [JP] Japan ................ 3-47175
Dec. 25, 1991 [JP] Japan ................ 3-342911

[51] Int. Cl.⁵ .............................. H01J 37/04
[52] U.S. Cl. ..................... 250/492.2; 250/492.1; 250/492.3; 250/493.1
[58] Field of Search .......... 250/423 R, 492.2, 492.21, 250/492.3, 398, 251, 492.1, 493.1; 315/111.81, 111.91; 313/359.1, 363

[56] References Cited

U.S. PATENT DOCUMENTS

| | | | |
|---|---|---|---|
| 3,602,752 | 8/1971 | Shriner | 250/298 |
| 4,361,762 | 11/1982 | Douglas | 250/251 |
| 4,543,487 | 9/1985 | Puumalainen et al. | 250/493.1 |
| 4,551,844 | 11/1985 | Arendt et al. | 250/423 P |
| 4,595,837 | 6/1986 | Wu et al. | 250/492.21 |
| 4,608,513 | 8/1986 | Thompson | 313/359.1 |
| 4,786,814 | 11/1988 | Kolondra et al. | 250/492.2 |
| 4,886,971 | 12/1989 | Matsumura et al. | 250/492.2 |
| 4,904,902 | 2/1990 | Tamai et al. | 315/111.81 |
| 4,916,311 | 4/1990 | Fuzishita et al. | 250/251 |
| 4,939,360 | 7/1990 | Sakai | 250/251 |

FOREIGN PATENT DOCUMENTS

| | | |
|---|---|---|
| 2-79628 | 3/1990 | Japan . |
| 1598626 | 4/1978 | United Kingdom . |
| 2147732 | 10/1983 | United Kingdom . |
| 2192751 | 5/1987 | United Kingdom . |

Primary Examiner—Jack I. Berman
Assistant Examiner—James Beyer
Attorney, Agent, or Firm—Lowe, Price, LeBlanc & Becker

[57] ABSTRACT

There is disclosed an electron shower apparatus which eliminates the adverse effect of a magnetic field on electrons and which provides electrons in sufficient quantity when primary electrons having low energy are employed. In the apparatus, the magnetic field generated by a filament current is decreased or eliminated by pulsing the filament current or by passing a current opposite in direction to the filament current in the vicinity of the filament current.

10 Claims, 12 Drawing Sheets

ELECTRON SHOWER APPARATUS INCLUDING FILAMENT CURRENT CONTROL

BACKGROUND OF THE INVENTION

1. Field of the Invention

The present invention relates to an electron shower apparatus provided as part of an ion implanting apparatus used for the production of semiconductors. The electron shower apparatus is used to prevent electrostatic discharge damage to insulating parts in a sample plate.

2. Description of the Background Art

FIG. 17 schematically shows a conventional ion implanting (irradiating) apparatus which is an ion beam irradiating apparatus disclosed in Japanese Patent Application No. 2-79628 by the applicant of the present invention. Reference numeral 1 designates an electron shower apparatus mounted to a Faraday cup 7; 2 designates a thermoelectronic emission source; 3 designates an electron extracting electrode; 20 designates an opening of the electron extracting electrode 3; 4 designates a decelerating electrode; 21 designates an opening of the decelerating electrode 4; 6 designates a power source for heating the thermoelectronic emission source 2; 8 designates a sample table; 9 designates a sample; 10 designates an ion beam; and 19 designates a power source for applying energy toward the sample 9 to electrons.

FIG. 18 illustrates the movement of an electron emitted from the thermoelectronic emission source 2 of FIG. 17. Reference numeral 22 designates equipotential surfaces formed between the extracting electrode 3 and decelerating electrode 4.

Operations will be described with reference to FIGS. 17 and 18. A decelerating electric field formed between the electron extracting electrode 3 and decelerating electrode 4 in the electron shower apparatus 1 of FIG. 17 is represented by the equipotential surfaces 22 of FIG. 18. An electron e⁻ 11 extracted from the thermoelectronic emission source 2 by the extracting electrode 3 enters the decelerating electric field perpendicularly to the axis of the ion beam 10. Since the electron 11 is decelerated perpendicularly to the equipotential surfaces 22 in the decelerating electric field, an emitting angle α of the electron 11 is expressed as:

$$\cos(\alpha + \theta) = \sqrt{Va/Vd} \cdot \sin\theta \quad (1)$$

where $\theta$ is an inclination angle of the equipotential surfaces 22 in the vicinity of the openings 20, 21 of the extracting and decelerating electrodes 3, 4 to the axis of the ion beam 10; Va is an extraction voltage; and Vd is a deceleration voltage.

The electron emitted from the decelerating electrode 4 and applied to the ion beam 10 has a component of velocity toward the sample 9. The generation of a slight potential at the power source 19 for applying energy toward the sample 9 to the electron enables the electron to travel toward the sample 9 without difficulty.

Relatively low energy electrons (primary electrons) are thus transported directly toward the sample, whereby the sample 9 charged positive by ions is neutralized while the sample 9 is prevented from being charged negative by the electrons.

Such a conventional process, however, has a problem in that a magnetic field generated by a heating current traps the low energy electrons so that the electrons in sufficient quantity to neutralize the positive charged sample 9 are not transported to the sample 9. The reason is discussed below. When the thermoelectronic emission source 2 is a bar-like tungsten filament of 1 mm in diameter, a filament heating current of 40 A or more in DC is required. A magnetic field B₀ generated by the filament heating current outside of the filament is expressed as:

$$B_0(r) = \mu_0 I/(2\pi r) \quad (2)$$

where $\mu_0$ is a magnetic permeability in a vacuum; I is a filament current; and r is a distance from the center of the filament.

The magnetic fields calculated from Equation 2 are 160 gauss and 40 gauss in the positions where I=40 A and r =0.5 mm and where I=40 A and r=2 mm, respectively.

The Larmor radius $r_L$ of the electron having energy of E eV in the position where the magnetic field is B gauss is expressed as:

$$r_L = \frac{mv}{eB} = \sqrt{\frac{2mE}{e}} \frac{1}{B} \quad (3)$$

where m is the mass of electron; and e is an elementary electric charge.

The Larmor radius is approximately 15 mm where the magnetic field is 40 gauss and electronic energy is 300 eV, and the Larmor radius is approximately 5 mm where the magnetic field is 40 gauss and electronic energy is 30 eV. The electronic energy of 300 eV is primary electronic energy frequently used in an electron shower of the type in which secondary electrons are utilized, and the electronic energy of 30 eV is primary electronic energy to be used in an electron shower of the type in which primary low energy electrons are utilized.

The Larmor radius of 15 mm at the energy of 300 eV is three to eight times larger than the spacing of 2 to 5 mm between the electrodes which is adopted in the practical electron shower, and the Larmor radius of 5 mm at the energy of 30 eV is only as approximately large as the spacing to a little over twice larger than the spacing. This provides the indication that the electron having the energy of 30 eV (low energy) is more susceptible to the magnetic field than the electron having the energy of 300 eV. When the primary electron having low energy (e.g., 30 eV or less) is used, an electron orbit is largely bent by the magnetic field, so that the electron strikes the electrodes. The electron is not extracted efficiently or the orbit of the extracted electron is largely bent. As a result, it is considered that the electrons in sufficient quantity are not transported to the target sample.

In the electron shower apparatus of the prior art, in practice, a current of several tens mA passes through the decelerating electrode opening 21 where the extraction voltage is 300 V and the deceleration voltage is 300 V (without deceleration), and a current of only 1 mA or less passes through the opening 21 where the extraction voltage is 300 V and the deceleration voltage is 30 V. However when the filament heating current is changed to an alternating current (sine wave), a peak of the current of approximately 20 mA is observed at the point where the filament heating current is zero when the extraction voltage is 300 V and the deceleration voltage is 30 V. It is apparent from these facts that the magnetic field generated by the filament current exerts adverse effect on the low energy electrons.

The quantitative result of the influence of the magnetic field generated by the filament current on neutralizing electrons is easily derived from an equation of motion of charged particles and the like. Detailed description thereof will be omitted herein.

Decrease in cross-sectional area of the filament 2 to increase the resistance of the filament 2 enable the filament heating current to decrease. This process, however, has disadvantages. One of the disadvantages is that the thin filament 2 is prone to thermal deformation and short lifetime. This is a demerit in long-time, stable, continuous drive of the electron shower apparatus 1. The other disadvantage is a large potential difference across the filament 2 because of a large proportion of increase in resistance compared with the proportion of decrease in current. This means large scatter of electron energies. This disadvantage prevents the electrons from going low energy and causes deviation of electron distribution. The filament 2, when shortened, prevents the disadvantage, but must be prepared in plurality for ensuring a shower current, resulting in a complicated structure.

SUMMARY OF THE INVENTION

According to an aspect of the present invention, an electron shower apparatus for irradiating a sample with thermoelectrons from a filament, comprises magnetic field decreasing and eliminating means for decreasing or eliminating a magnetic field generated by a filament current for use in heating the filament.

This provides for the elimination of adverse effect of the magnetic field on electrons. Sufficient electrons are applied to the target when primary electrons having low energy are used.

Preferably, filament current control means pulses and controls the filament current.

Since the filament current control means for the electron shower apparatus of the present invention pulses the filament current and extracts the thermoelectrons when no current flows and the magnetic field and potential difference across the filament are both zero, a low energy shower having no scatter in energy and in sufficient quantity is obtained. This is achieved very easily only by switching from a DC power source to a pulse power source.

Preferably, the electron shower apparatus further comprises control state measuring means for measuring a control state which is the quantity of electron shower current or an electrification distribution of the sample.

The filament current control means controls a duty cycle of pulses of the filament current or the quantity of filament current as a function of the control state, whereby real-time control of the quantity of electron shower is achieved.

According to another aspect of the present invention, an electron shower apparatus for irradiating a sample with thermoelectrons from first and second filaments respectively, comprises: first filament current control means for controlling the quantity of filament current for use in heating the first filament; and second filament current control means for controlling the quantity of filament current for use in heating the second filament, the first and second filament current control means decreasing or eliminating magnetic fields generated by the first and second filaments respectively, at least one of the first and second filament current control means performing control to irradiate the sample constantly with the thermoelectrons.

In the electron shower apparatus according to the second aspect of the present invention, the irradiation of the first and second filament current control means is controlled by, for example, adjusting the frequency of the filament currents and the duty cycle of pulses. Therefore, an electron shower of low energy and of large current is achieved.

Preferably, the magnetic field decreasing and eliminating means includes reverse current supply means provided adjacent to the filament for supplying a reverse current in a direction opposite to the filament current.

Since the reverse current supply means passes the reverse current, the magnetic field generated by the filament current is decreased or eliminated when the filament current is fed at a constant level. A low energy shower in sufficient quantity is achieved.

Preferably, the electron shower apparatus further comprises control state measuring means for measuring a control state which is the quantity of electron shower current or an electrification distribution of the sample.

As a function of the control state, magnetic field decreasing filament current control means controls the quantity of magnetic field decreasing filament current. This provides for real-time control of the quantity of electron shower.

Preferably, the magnetic field decreasing filament current control means controls said magnetic field decreasing filament current to vary a magnitude of a magnetic field generated by the reverse current in each part of the magnetic field decreasing filament to control an electron shower distribution.

This provides for real-time control of a shower current density distribution in conformity with the electrification distribution of the sample. The electrification distribution of the sample includes a correlation between a current density distribution of an ion beam charging the sample and the electron shower distribution.

Preferably, the electron shower apparatus further comprises electron shower irradiation position control means for controlling an electron shower irradiation position, the electron shower irradiation position control means controlling the electron shower irradiation position as a function of the electrification distribution of the sample.

This provides for real-time control of the position of the electron shower in conformity with the electrification distribution of the sample.

It is an object of the present invention to provide an electron shower apparatus which eliminates adverse effect of a magnetic field on electrons such that primary electrons having low energy in sufficient quantity are fed to a target.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
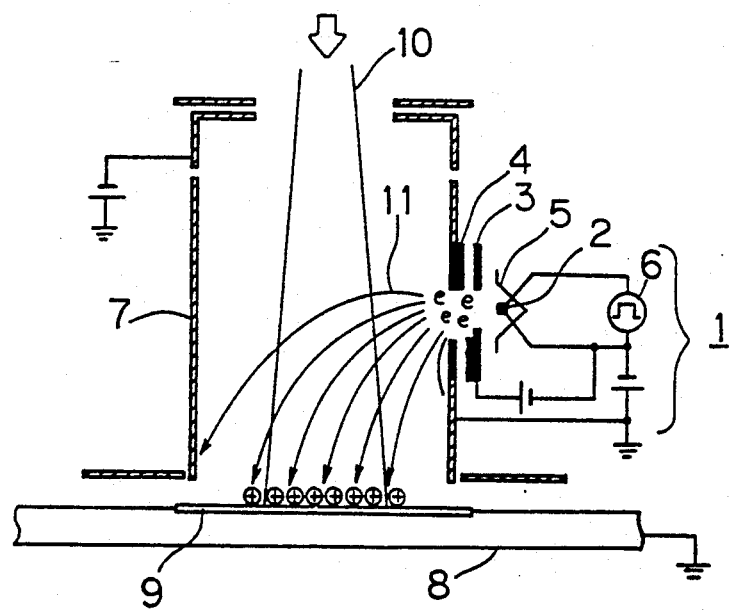
FIG. 1 is a cross-sectional view of an electron shower apparatus according to a first preferred embodiment of the present invention.

Referring now to drawings, description will be given on preferred embodiments of the present invention hereinafter. FIG. 1 shows an electron shower apparatus of a first preferred embodiment according to the present invention. Reference numeral 1 designates an electron shower apparatus mounted to a Faraday cup 7; 2 designates a thermoelectronic emission source (filament); 3 designates an electron extracting electrode; 4 designates a decelerating electrode; 5 designates a repeller; 6 designates a filament heating pulse power source; 9 designates a sample (wafer) disposed on a sample table (rotary disc) 8; 10 designates an ion beam; and 11 designates an electron shower.

Operations in the first preferred embodiment will be described below. In FIG. 1, the sample (wafer) 9 disposed on the sample table (rotary disc) 8 is irradiated with the ion beam 10. Positive charge of ions is accumulated on an insulator on the sample, so that the sample 9 is positive charged. The electron shower apparatus 1 mounted to the Faraday cup 7 monitoring the quantity of ion beam current is driven and irradiates the sample 9 with the electron shower 11 to neutralize the positive charged sample 9.

Figure 2A:
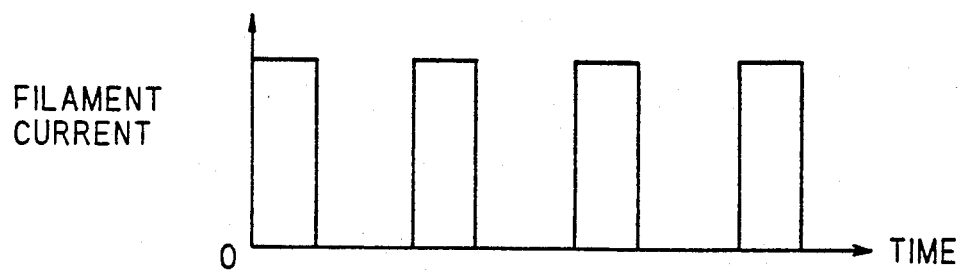
FIGS. 2A to 2D are timing charts illustrating a filament current, a magnetic field generated by the filament current, a filament temperature and an electron shower current, respectively, in the first preferred embodiment.
Figure 2B:
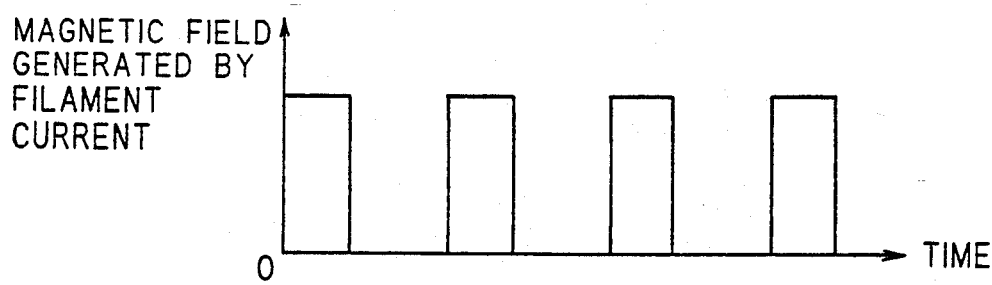
Figure 2C:
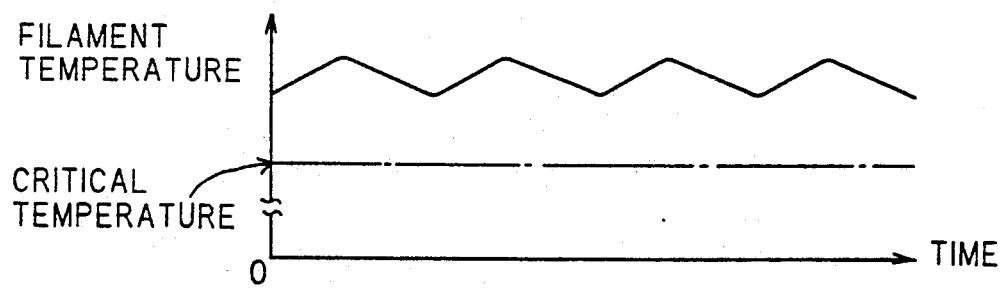

The drive of the electron shower apparatus 1 is described in details. There is shown in FIG. 2A an example of pulse waveforms generated from the filament heating power source 6. A magnetic field is generated and disappears depending on the current of FIG. 2A, as shown in FIG. 2B. The temperature of the filament rises when the filament is carrying the current, and the temperature thereof falls when the filament is not carrying the current. However, when the pulse has a certain degree of high frequency, a heating cycle is short as compared with change in temperature, and the temperature does not fall so largely as to be regarded as approximately constant, as shown in FIG. 2C. The critical temperature of FIG. 2C is a minimum temperature which satisfies a space charge limited region with respect to the extraction voltage to be used. As will be apparent from FIG. 2C, when sufficient applied power and pulse cycle are ensured, the temperature of the filament is still maintained in the space charge limited region while no current flows, and thermoelectrons are stably supplied. The extraction of the thermoelectrons in the period of no filament current flow by the extracting and decelerating electrodes 3 and 4 provides for the extraction and transportation of the electrons in sufficient quantity because of no influence of the magnetic field generated by the filament current. (The mechanism of the transportation of the preferred embodiment is identical with that of the prior art.) Since a potential difference across the filament becomes zero, there is no scatter in electron energy. This is advantageous for reduction of electron energy. In the first preferred embodiment, the ratio of the period of filament current flow to the period of no filament current flow is set to 2:3.

Figure 2D:
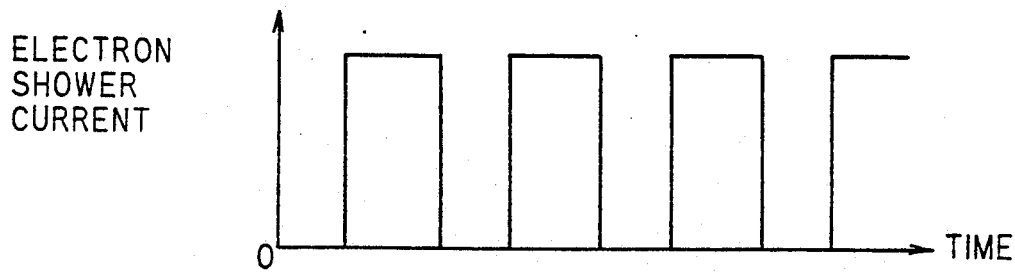

The electrons transported in large quantity, which hold low energy, do not cause negative charge damages but prevent the positive charge on the sample 9. (The repeller 5 restricts heat radiation from the filament and emission of electrons from the filament by negative potential.) FIG. 2D shows the quantity of electron shower current after the current passes through the decelerating electrode 4. A peak current is approximately 10 mA (approximately 5 mA on average) in an experiment.

Figure 3:
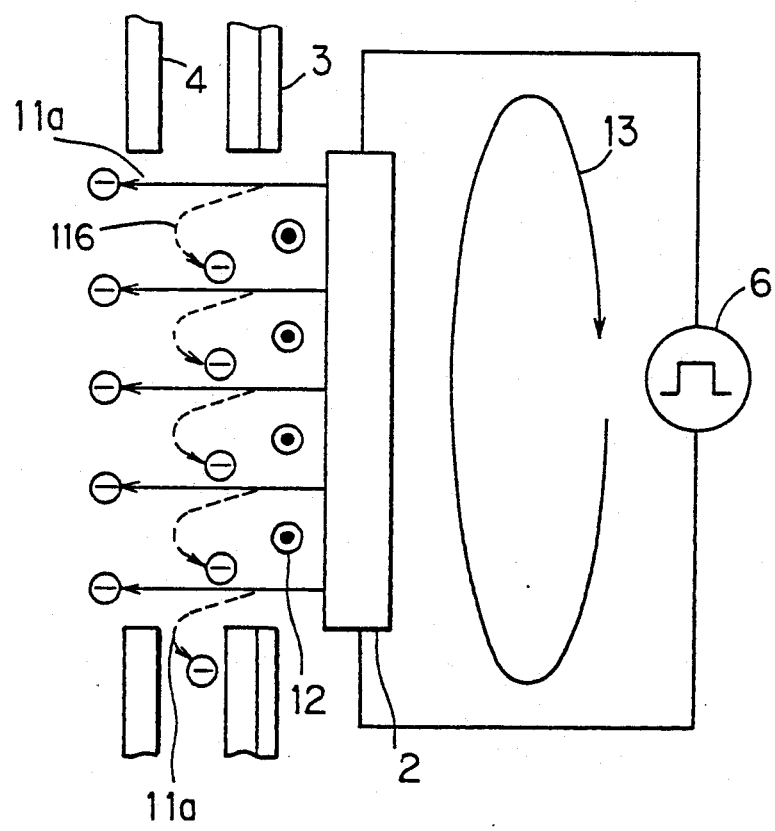
FIG. 3 illustrates a difference between an electron orbit when the magnetic field generated by the filament current is present and an electron orbit when the magnetic field is absent.

FIG. 3 shows a model of the influence of the magnetic field at this time, in longitudinal section of the filament of the electron shower apparatus. The solid arrows 11a of FIG. 3 indicate electron orbits where the magnetic field 12 is absent, and the broken arrows 11b thereof indicate electron orbits which are bent by the magnetic field 12.

Second Preferred Embodiment

A duty cycle of the heating current is 40% in FIG. 2. However, decrease in duty cycle with constant power being applied enables the period of no heating current flow to be prolonged with substantially similar heating state, thereby increasing the quantity of shower current.

For real-time control of the quantity of electron shower current in a second preferred embodiment, the quantity of electron shower or an electrification distribution of the sample 9 is initially measured. The duty cycle of the heating current should be decreased when the result of measurement is smaller than the desired quantity of electron shower, and the duty cycle should be increased when the result is larger than the desired quantity. The quantity of electron shower is calculated from a difference between an current value during ion beam irradiation and a current value during electron shower irradiation which are measured by, for example, a galvanometer connected to the rotary disc 8.

The electrification distribution of the sample 9 is measured by, for example, a charge sensor.

Third Preferred Embodiment

Figure 4A:
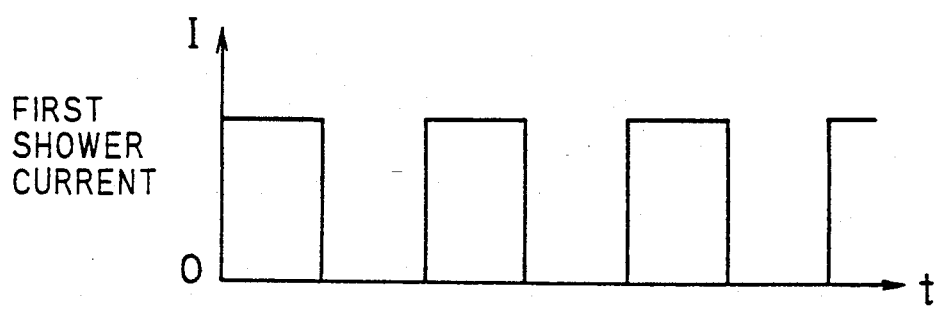
FIGS. 4A to 4C illustrate the production of a synthetic direct current from shower currents according to a third preferred embodiment of the present invention.
Figure 4B:
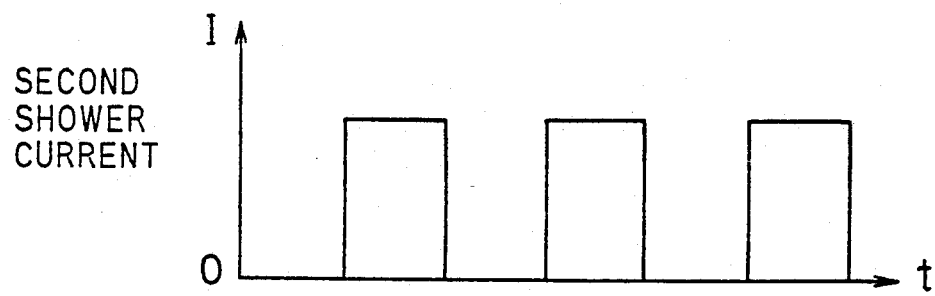
Figure 4C:
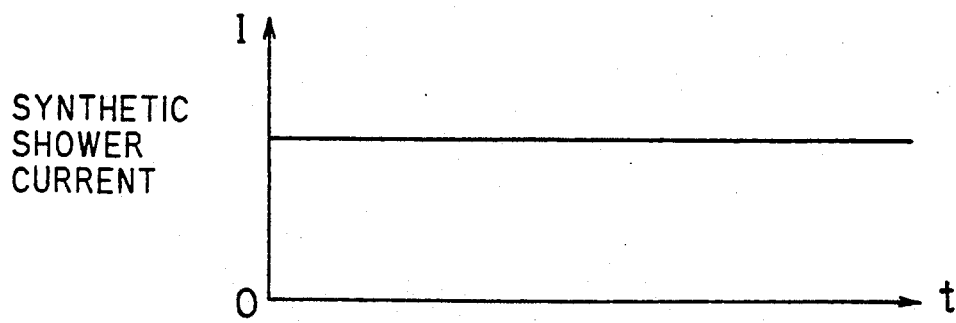

Another pulse heating electron shower apparatus of the same type is provided in an opposite position, and the heating frequency of the filament and the heating duty cycle are suitably adjusted. This provides for not only increase in the quantity of current but also a synthetic shower current which appears to be a direct current. The shower currents are shown in FIGS. 4A to 4C. FIG. 4 shows the synthetic shower current in the first and second electron shower apparatuses when the shower current in the first electron shower apparatus varies with time as shown in FIG. 4A and the shower current in the second electron shower apparatus varies with time as shown in FIG. 4B. Increase in the quantity of electron shower is exerted advantageously on further decrease in electron energy.

Fourth Preferred Embodiment

The heating current has square waves in the first to third preferred embodiments in which the pulse heating electron shower apparatus is used. The present invention is not limited to the square waves such as pulses. Any wave, for example a sine wave, which enables the supply of power necessary to heat the filament and has a portion of a weak magnetic field, is available for use.

Fifth Preferred Embodiment

Figure 5A:
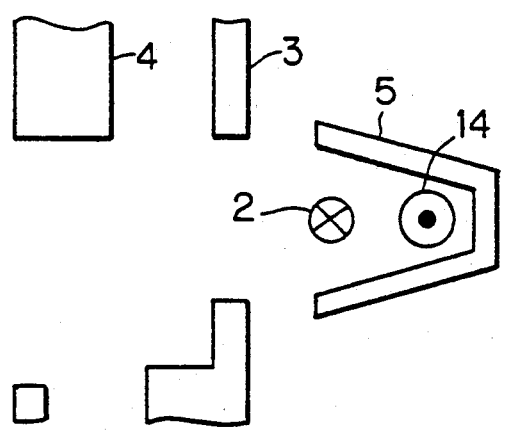
FIGS. 5A and 5B show major part of the electron shower apparatus according to a fifth preferred embodiment of the present invention.
Figure 5B:
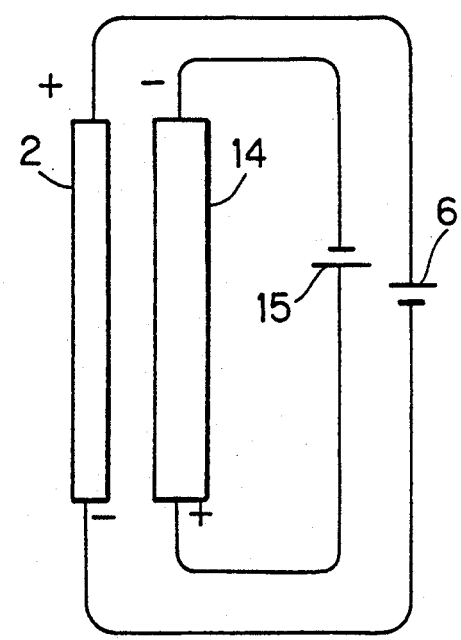

FIGS. 5A and 5B show major part of the electron shower apparatus of a fifth preferred embodiment according to the present invention. FIG. 5A is a top view, and FIG. 5B is a side view. Reference numeral 14 designates a magnetic field decreasing filament for passing a reverse current in the opposite direction to the filament current in the vicinity of the filament current; and 15 designates a power source therefor. Other components of FIGS. 5A and 5B are identical with those of FIG. 1.

Operations in the fifth preferred embodiment will be described below. When the reverse current flows in the magnetic field decreasing filament 14 in the opposite direction to the current in the thermoelectronic emission filament 2, the two filament currents generate oppositely directed magnetic fields which function to counteract each other.

In a space adjacent to the extracting electrode 3, the magnetic field does not relatively decreased but remains in a position deviated from a plane including the axes of the filaments 2 and 14. Since the direction of the line of remaining magnetic force approximately coincides with a direction in which the electrons are extracted, restriction of a space charge effect to emit the electrons perpendicularly to the extraction direction is expected. In practice, the quantity of direct current shower is larger than the peak level of the pulse shower when the electrons having a certain level of energy or more are used.

The current flowing in the magnetic field decreasing filament 14, which is behind the thermoelectronic emission filament 2 (as viewed in the electron extraction direction), must be several times larger than the current flowing in the thermoelectronic emission filament 2. For restraining adverse effect by heat, the magnetic field decreasing filament 14 should be larger in diameter than the thermoelectronic emission filament 2. Two power sources are normally required to cause the two filaments to conduct different currents. However, the provision of one power source may be sufficient by the use of resistive division.

The potential at the magnetic field decreasing filament 14 should be lower than the potential at the thermoelectronic emission filament 2 so as not to reduce the effect of the repeller 5.

Sixth Preferred Embodiment

Figure 6A:
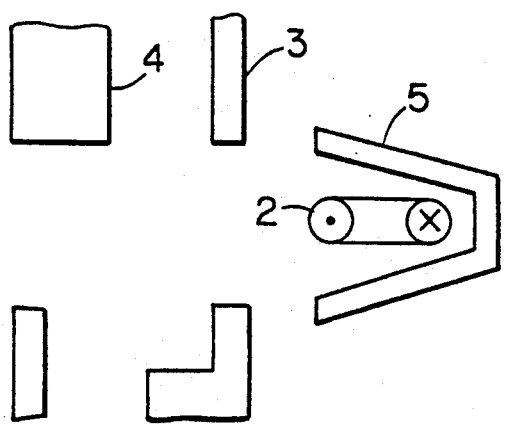
FIGS. 6A and 6B show major part of the electron shower apparatus according to a sixth preferred embodiment of the present invention.
Figure 6B:
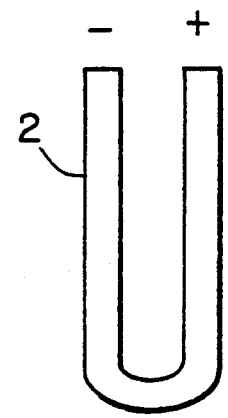

FIG. 6A shows the electron shower apparatus equipped with a U-shaped filament as an example of simple structures which permit the magnetic field to decrease to some extent. FIG. 6B is a side view of the U-shaped filament 2 of FIG. 6A. This structure is simple because of a smaller number of holding portions of the filament 2 as compared with the structure using the two filaments 2 and 14 of the fifth preferred embodiment. There is no need to provide the reverse current power source 15.

When the U-shaped filament is not available, the same effect can be obtained with ease by two filaments disposed in parallel and connected to each other at their corresponding ends with refractory metal.

Seventh Preferred Embodiment

Figure 7A:
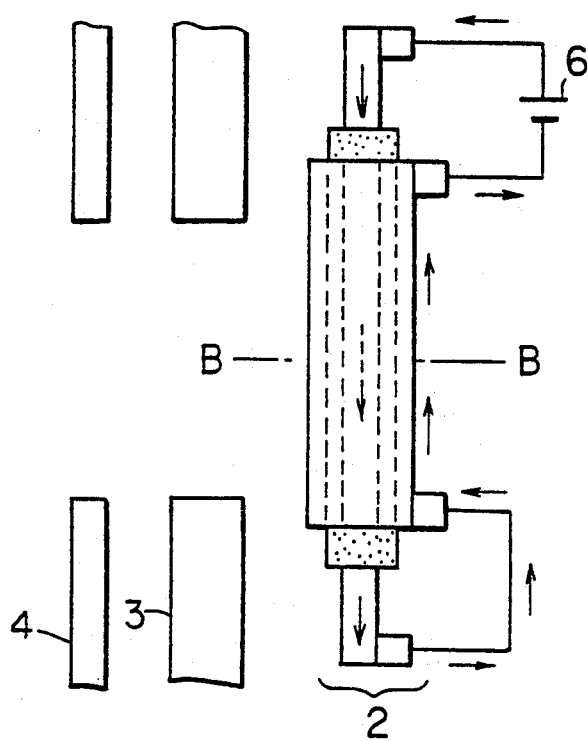
FIGS. 7A and 7B show major part of the electron shower apparatus according to a seventh preferred embodiment of the present invention.
Figure 7B:
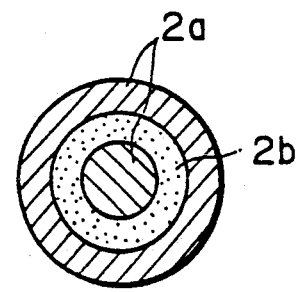

FIG. 7A shows a seventh preferred embodiment of the present invention, and FIG. 7B is a cross-sectional view taken along the line B—B of FIG. 7A. Reference character 2a designates refractory metal such as tungsten; and 2b designates an insulator. Other components of FIGS. 7A and 7B are identical with corresponding parts of FIG. 1.

Operations in the seventh preferred embodiment will be described below. With reference to FIG. 7B, the core and peripheral part of the filament are made of the refractory metal 2a such as tungsten, and the ceramic 2b resistant to high temperatures (about 2000° C.) is inserted therebetween. Currents in equal quantity and in opposite directions are applied to the core and peripheral part of the filament made of the refractory metal 2a inside and outside the ceramic 2b, so that the magnetic field generated by the filament current is zero in the exterior of the filament.

The one power source 6 is sufficient because of the equal magnitude of current inside and outside the ceramic 2b, resulting in a simple structure.

The filament has similar effect without the insulator. The outside cylinder of the filament may be replaced with a spiral one.

Eighth Preferred Embodiment

Figure 8A:
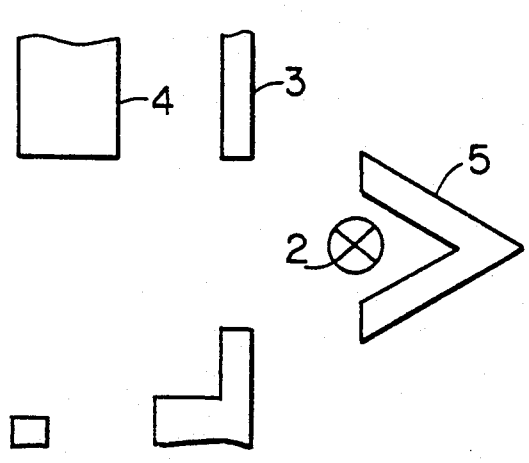
FIGS. 8A and 8B show major part of the electron shower apparatus according to an eighth preferred embodiment of the present invention.
Figure 8B:
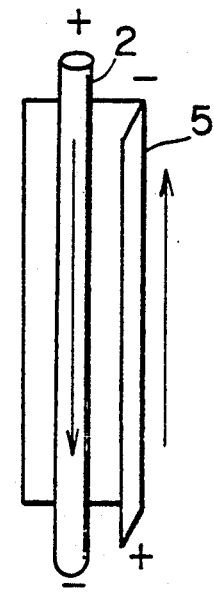

The magnetic field decreasing filament 14 is provided behind the thermoelectronic emission filament 2 in the fifth preferred embodiment shown in FIGS. 5A and 5B. With reference to FIGS. 8A and 8B which are, respectively, top and side views of an eighth preferred embodiment of the present invention, the reverse current flows in the repeller 5, to thereby provide a simple structure and similar effect.

Ninth Preferred Embodiment

Figure 9:
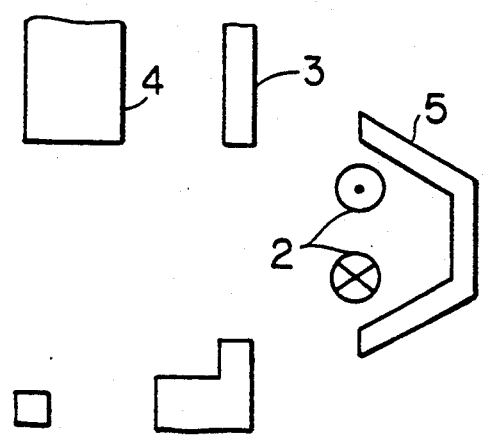
FIG. 9 is a top view of major part of the electron shower apparatus according to a ninth preferred embodiment of the present invention.

Two thermoelectronic emission filaments 2 prepared as shown in FIG. 9 are carrying current in the opposite directions to decrease the magnetic field. The use of the thermoelectrons from both of the filaments 2 increases the number of thermoelectrons. Thus further increase in the number of low energy electrons is expected.

Since the magnetic field generated by the filament current is steadily decreased by the reverse current, the DC shower current in sufficient quantity is obtained with low energy.

The quantity of electron shower current is controlled by controlling at least either the filament current or the reverse current in the fifth to ninth preferred embodiments. In the electron shower apparatuses of the fifth to ninth preferred embodiments, the quantity of electron shower is controlled by measuring the quantity of electron shower current or the electrification distribution of the sample 9 and by controlling at least either the filament current or the reverse current as a function of the result of measurement. Specifically, when the result is different from the desired quantity of electron shower current, the magnitude of the filament and reverse currents are varied as a function of an algorithm in accordance with correlation between the quantity of electron shower current obtained previously by an experiment and the magnitude of the filament and reverse currents. This provides for real-time control of the quantity of electron shower current with respect to the desired value.

The magnetic field does not reach zero in some cases in some of the preferred embodiments. In this case, the combination of the pulse heating techniques of the first preferred embodiment (in FIG. 1) permits the electron shower to go lower energy and larger current.

Tenth Preferred Embodiment

Figure 10:
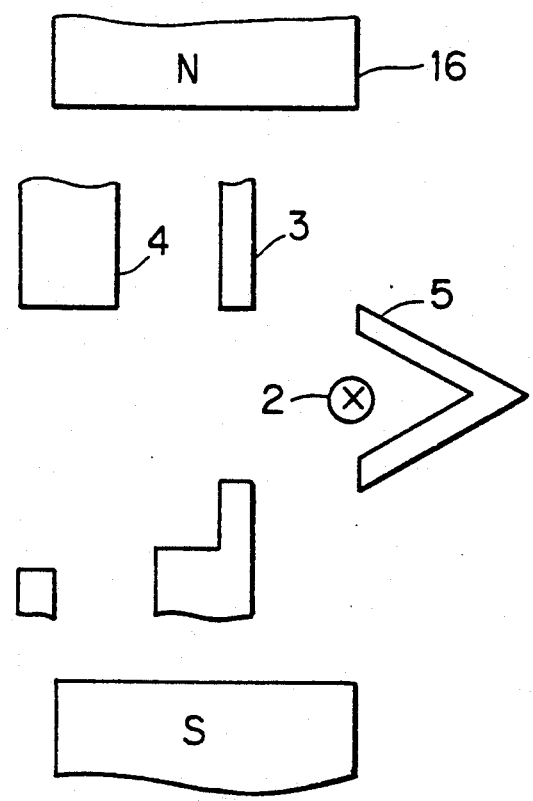
FIG. 10 is a plan view of major part of the electron shower apparatus according to a tenth preferred embodiment of the present invention.

There is shown in FIG. 10 a process for cancelling the filament magnetic field by applying a magnetic field to the filament magnetic field from the exterior. Reference numeral 16 designates an electromagnet or a natural magnet disposed in the direction which permits the magnetic field generated by the filament current to be cancelled. Other components of FIG. 10 are identical with corresponding parts of FIG. 1.

Operations in the tenth preferred embodiment will be described below. As above mentioned, decrease in the magnetic field generated by the filament current in the vicinity of the filament 2 increases the quantity of electron shower. When current flows in the filament 2 of FIG. 10 from the surface side of the drawing toward the reverse side thereof, N and S poles of the electromagnet or natural magnet should be arranged in the manner shown in FIG. 10. It is apparent that the electromagnet (or natural magnet) should be powerful near the filament 2 and become less powerful as the distance from the filament 2 increases, in accordance with the strength of the magnetic field generated by the filament current. The tenth preferred embodiment is also effective similarly to the foregoing preferred embodiments. The natural magnet must be adapted to be used at a temperature not higher than the Curie-point by cooling. A magnetic field shield should be provided in the Faraday cup to prevent leak of unnecessary magnetic field when the natural magnet, electromagnet or other magnets are used.

Eleventh Preferred Embodiment

Figure 11:
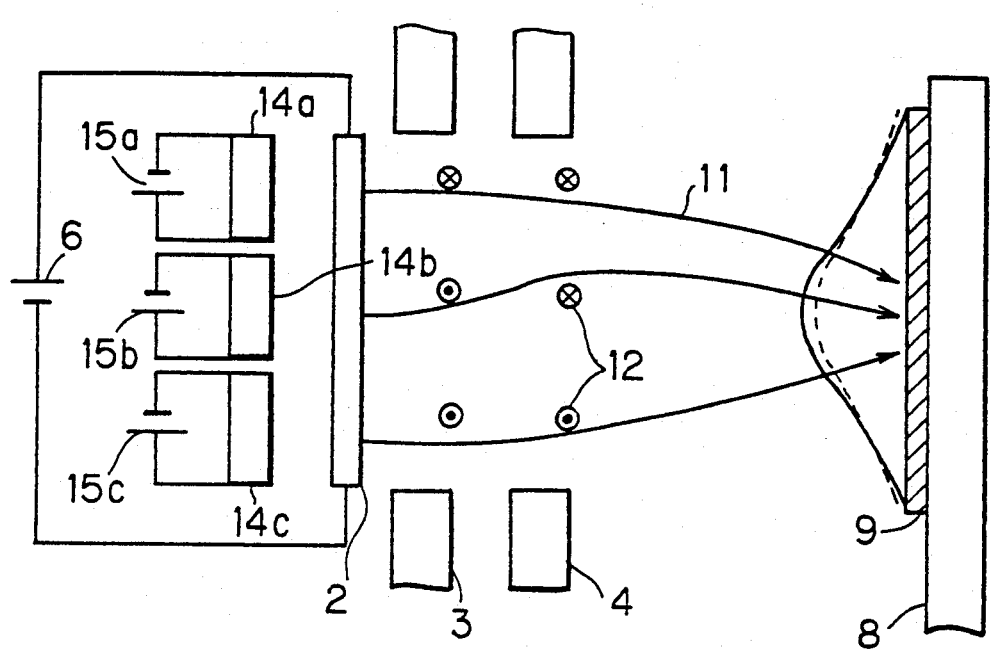
FIG. 11 is a cross-sectional view of an eleventh preferred embodiment of the present invention.

FIG. 11 is a cross-sectional view of an eleventh preferred embodiment of the present invention. Reference numerals 1 to 15 of FIG. 11 designate like or corresponding parts of FIG. 1. The reverse current filament 14 is divided into three portions (upper portion 14a, middle portion 14b and lower portion 14c). Magnetic field decreasing filament power sources 15a, 15b, 15c are provided in corresponding relation to the respective portions 14a, 14b, 14c, such that the quantities of reverse current are varied independently.

In the electron shower apparatus 1 thus constructed, the quantities of reverse current are variable respectively in the upper portion 14a, middle portion 14b and lower portion 14c. The filament heating current flows downwardly in FIG. 11, and the reverse current flows upwardly. When the quantity of reverse current in the upper portion 14a is larger and the quantity of reverse current in the lower portion 14c is smaller than the quantity of reverse current in the middle portion 14b the magnetic field generated by the reverse current has an increasing influence on the electrons in an upper portion of the thermoelectronic emission filament 2 and the magnetic field generated by the filament heating current has an increasing influence on the electrons in a lower portion thereof. In the case where the reverse current in the middle portion 14b is set such that the thermoelectrons produced in a middle portion of the thermoelectronic emission filament 2 reach a middle portion of the wafer 9, the thermoelectrons produced in the upper and lower portions of the thermoelectronic emission filament 2 are deflected to the middle portion of the wafer 9. A shower current density distribution in conformity with a current density distribution of the ion beam 10 is obtained by suitable adjustment of the quantities of reverse current in the upper and lower portions 14a and 14c. An orbit image of the electron shower 11 at this time is shown in FIG. 11. For example, when the peak of the current density of the ion beam 10 deviates upwardly in FIG. 11, the adjustment is carried out such that the quantity of reverse current is small in the middle portion 14b and is much smaller in the lower portion 14c, with the quantity in the upper portion 14a maintained as it is set initially. This enables the current density distribution of the electron shower 11 to accord with that of the ion beam 10. The distribution of the electron shower 11 is thus controllable. It is apparent that the control process is inverted when the directions of connection of the thermoelectronic emission filament power source 6 and magnetic field decreasing filament power source 15 are inverted. The same is true for preferred embodiments described below.

Twelfth Preferred Embodiment

Figure 12:
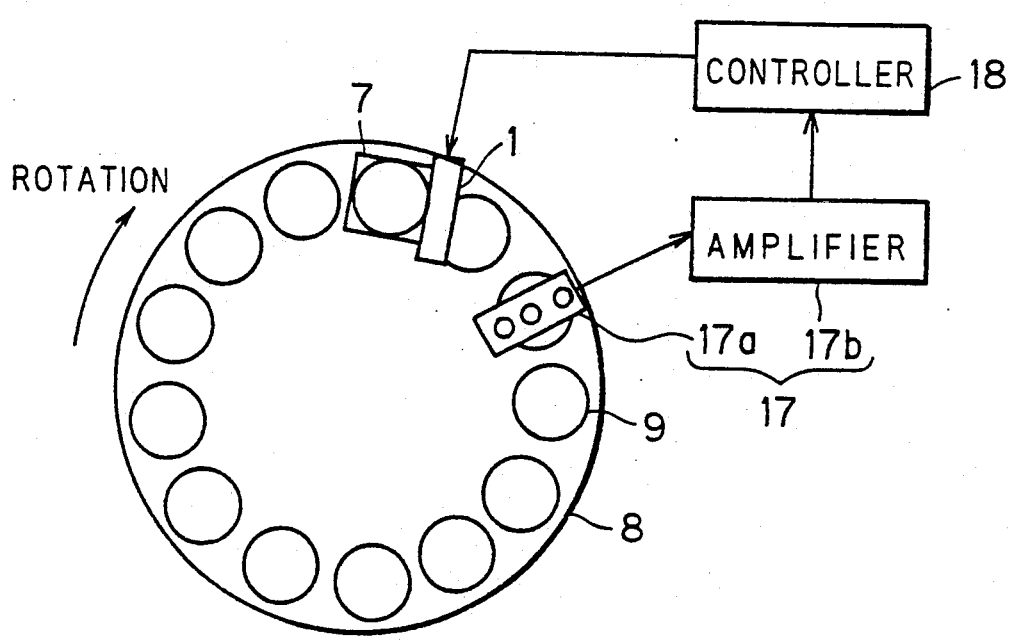
FIG. 12 is a cross-sectional view of a twelfth preferred embodiment of the present invention.
Figure 13:
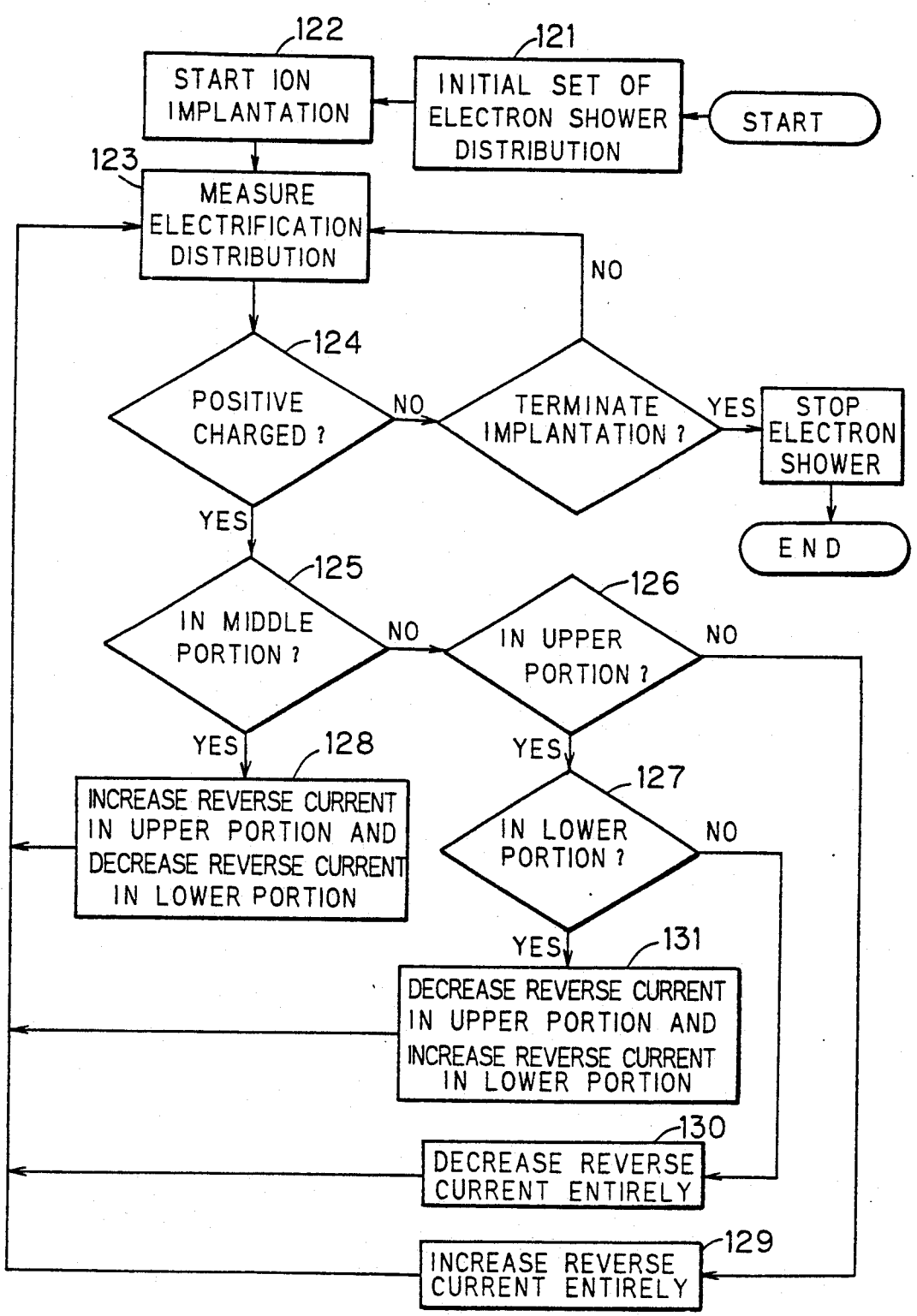
FIG. 13 is a flow chart showing a control algorithm of the twelfth preferred embodiment.

FIG. 12 shows a twelfth preferred embodiment, in which there are provided an electrification distribution measuring apparatus 17 for the wafer and a reverse current quantity controller 18 in addition to the structure of the eleventh preferred embodiment. The controller 18 controls the quantities of reverse current respectively in the upper portion 14a, middle portion 14b and lower portion 14c of the magnetic field decreasing filament as a function of the result of measurement of the measuring apparatus 17. The electrification distribution measuring apparatus 17 is composed of a charge sensor 17a mounted above the wafers 9 disposed on the sample table 8 and an amplifier 17b. The amplifier 17b amplifies a signal detected by the charge sensor 17a to output the electrification distribution of the wafers 9 to the controller 18. Referring to FIG. 13, a flow of control by the controller 18 will be described below. First, the current density distribution of the ion beam 10 is previously obtained by measurement and the like. The current density distribution of the electron shower 11 is roughly set in accordance with the current density distribution of the ion beam 10 by the adjustment of the reverse current (121). On starting practical ion implantation (122), the electrification distribution measuring apparatus 17 measures the electrification distribution of the wafer 9 (123). As a result, when positive charge is found in a position in which the wafer 9 lies (124), the reverse current is controlled such that the electrons are concentrated in the position. The quantity of reverse current is entirely decreased (130) when positive charge appears in the upper portion of the thermoelectronic emission filament 2 of FIG. 12 (126). Conversely, the quantity of reverse current is entirely increased (129) when positive charge appears in the lower portion of the thermoelectronic emission filament 2 (127). When positive charge appears in a portion corresponding to the middle portion of the thermoelectronic emission filament 2 (125), the quantity of reverse current in the upper portion 14a of the magnetic field decreasing filament is increased and the quantity of reverse current in the lower portion 14c is decreased so that more electrons are concentrated in the portion (128). When positive charge appears separately in the upper and lower portions of the thermoelectronic emission filament 2 (126, 127), the quantity of reverse current in the upper portion 14a is decreased and the quantity of reverse current in the lower portion 14c is increased (131).

In the example of the control Of FIG. 13, a medium reverse current control of the implantation is carried out. However, only the electron shower distribution should be controlled in the initial stage of the implantion when small fluctuation with time is found in the ion beam.

Thirteenth Preferred Embodiment

The magnetic field decreasing filament 14 is divided into the three portions in the eleventh and twelfth preferred embodiments. It is apparent that finer control is achieved by the increasing number of divisions.

Fourteenth Preferred Embodiment

The number of magnetic field decreasing filament power sources 15 corresponds to the number of divisions of the magnetic field decreasing filament 14 in the eleventh and twelfth preferred embodiments. Only one magnetic field decreasing filament power source 15 provides similar effect when the reverse current in the respective divided portions of the magnetic field decreasing filament 14 is controlled by variable resistances inserted in parallel into the respective divided portions of the magnetic field decreasing filament 14.

Fifteenth Preferred Embodiment

Similar effects are obtained when a reverse current fine adjustment filament is additionally provided, with the two filaments maintained intactly.

Sixteenth Preferred Embodiment

Figure 14A:
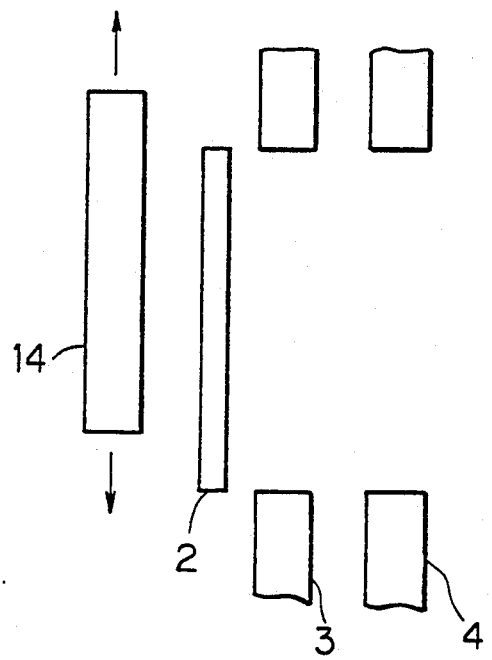
FIGS. 14A and 14B are cross-sectional views of a sixteenth preferred embodiment of the present invention.
Figure 14B:
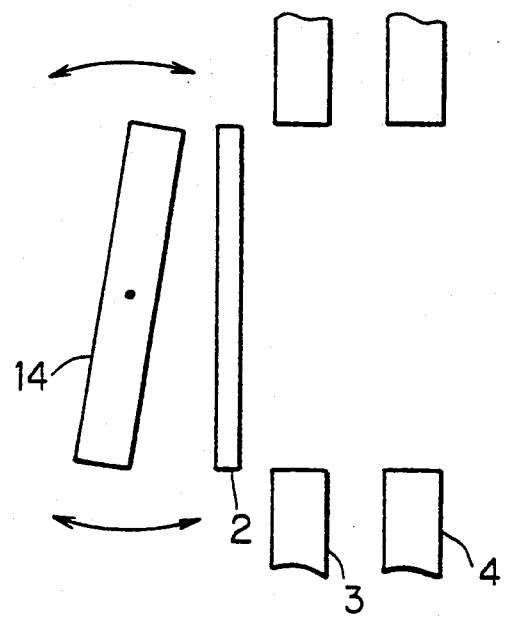

There may be provided a mechanism for moving the magnetic field decreasing filament 14 longitudinally of the filament 2 as shown in FIG. 14A or a mechanism for varying an angle between the two filaments 2 and 14 as shown in FIG. 14B in place of the division of the magnetic field decreasing filament 5 to obtain similar effects.

Seventeenth Preferred Embodiment

When fine control is unnecessary, the magnetic field decreasing filament 14 is shifted longitudinally of the thermoelectronic emission filament 2 or is disposed at varied angles, whereby a focusing effect is obtained.

Eighteenth Preferred Embodiment

It is similarly effective to use an ion beam measuring apparatus and an electron shower distribution measuring apparatus in place of the electrification distribution measuring apparatus 17 for the sample in the foregoing control. The ion beam and shower electron distribution measuring apparatuses are fixedly disposed below the rotary disc 8 under the sample 9 of FIG. 1.

Nineteenth Preferred Embodiment

Figure 15:
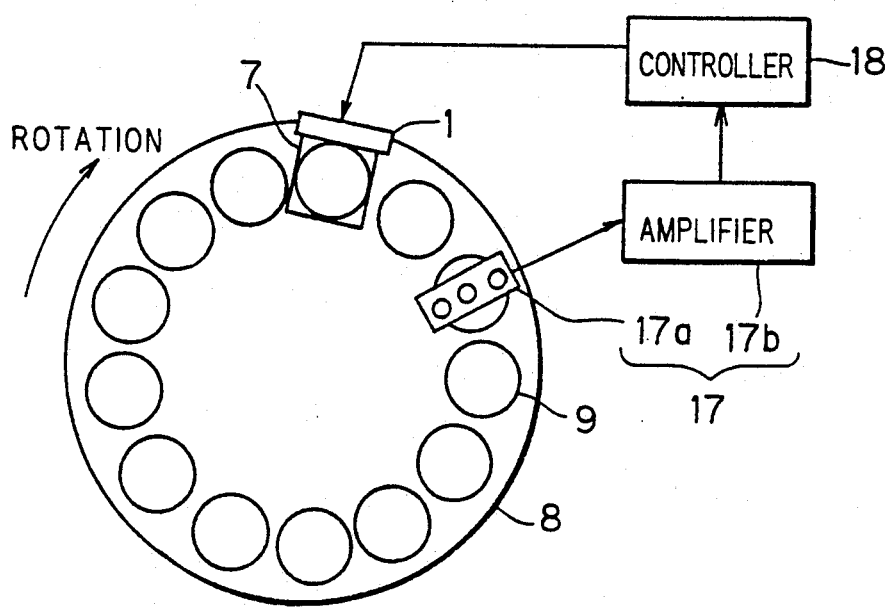
FIG. 15 is a cross-sectional view of a nineteenth preferred embodiment of the present invention.

FIG. 15 shows the electron shower apparatus having irradiation position control for electron shower according to a nineteenth preferred embodiment of the present invention. Reference numeral 18 designates an apparatus for controlling a potential at the extracting electrode 3 as a function of the result of measurement of the electrification distribution measuring apparatus 17 for the samples. Other components of FIG. 15 are identical with corresponding parts of FIG. 12.

Operations in the nineteenth preferred embodiment will be described below. It is apparent from Equation 1 that the deflection angle $\alpha$ of the electron varies when the extraction voltage varies at a constant deceleration voltage. The control of the extraction voltage by the feedback of the electrification distribution measurement result enables real-time control of the electron shower irradiation position.

Figure 16:
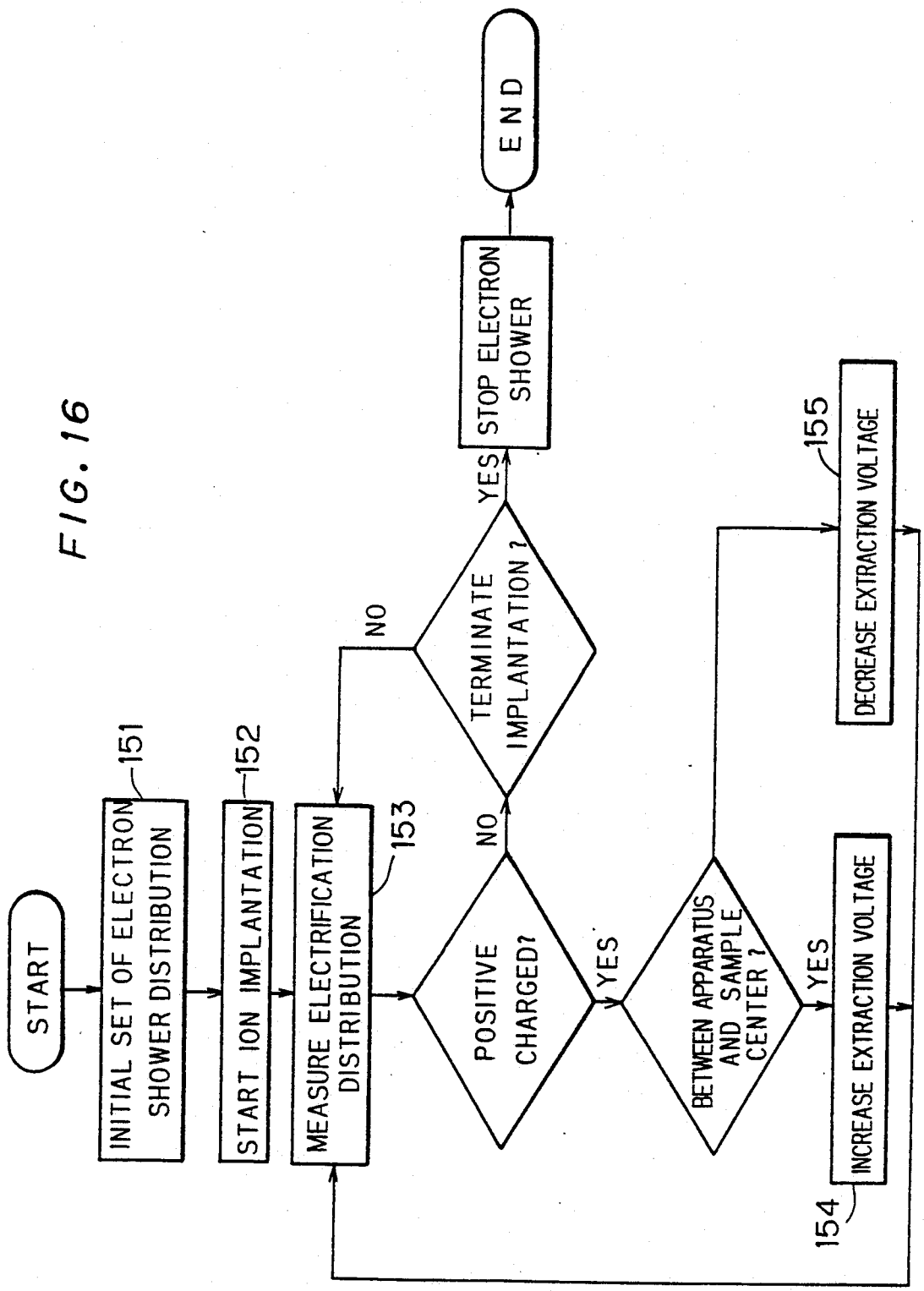
FIG. 16 is a flow chart showing a control algorithm of the nineteenth preferred embodiment.
Figure 17:
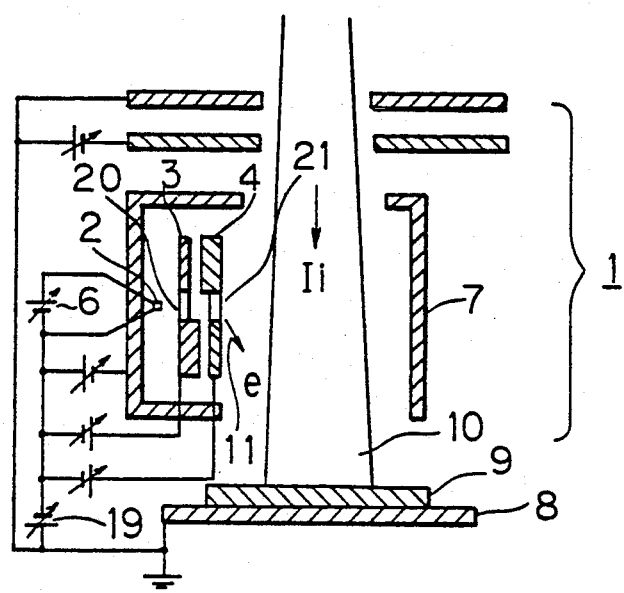
FIG. 17 is a cross-sectional view of a conventional electron shower apparatus.
Figure 18:
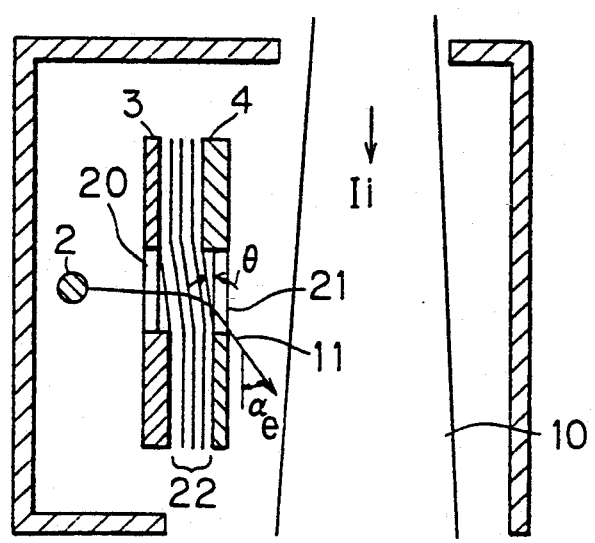
FIG. 18 illustrates an electron orbit in the conventional electron shower apparatus of FIG. 17.

FIG. 16 shows an example of the operation control algorithms. The irradiation positions of the ion beam 10 and electron shower 11 are made to coincide with each other in the initial setting (151). On starting the ion implantation (152), the electrification distribution measuring apparatus 17 measures the electrification distribution of the sample (153). As a result, the extraction voltage is increased (154) when positive charge is found in a half region of the sample which is between the electron shower apparatus 1 and the center of the sample. Conversely, the extraction voltage is decreased (155) when positive charge is found in the other half region of the sample. The operation of measurement (153) and control (154, 155) is repeated until positive charge is reduced to zero. Then variation in extraction voltage is stopped. The implantation and, accordingly, the control are terminated. Such control provides for real-time control of the electron shower 11 in accordance with fluctuation of the ion beam 10 with time.

The foregoing example may be used in batch control executed at suitable time intervals as well as in real-time control.

Similar effects are obtained when the ion beam and electron shower distribution measuring apparatuses are substituted for the electrification distribution measuring apparatus 17 in the foregoing control.

The foregoing control is effective for all electron shower apparatuses which control the deflection of electrons by varying the ratio of the extraction voltage to the deceleration voltage.

The shower current density distribution is controlled in parallel to the length of the filament, and the shower current position is controlled perpendicularly to the length of the filament. The combination of the foregoing control with the shower current density distribution control process executed by the reverse current control enables finer control of the shower current density distribution, whereby an improved neutralizing effect is expected.

All of the mechanisms for decreasing or eliminating the filament magnetic field in the present invention are applicable to low energy electron use apparatuses which utilize thermoelectrons from the filament.

While the invention has been shown and described in detail, the foregoing description is in all aspects illustrative and not restrictive. It is therefore understood that numerous modifications and variations can be devised without departing from the scope of the invention.

What is claimed is:

1. An electron shower apparatus for irradiating a sample with thermoelectrons from first and second filaments respectively, comprising:

first filament current control means for controlling the quantity of filament current for use in heating said first filament;

second filament current control means for controlling the quantity of filament current for use in heating said second filament; and control state measuring means for measuring a control state which is the quantity of electron shower current or an electrification distribution of said sample, said first and second filament current control means decreasing or eliminating magnetic fields generated by said first and second filaments respectively, at least one of said first and second filament current control means performing control to irradiate said sample constantly with said thermoelectrons; and said first and second filament current control means pulsing said first and second filament currents and controlling duty cycles of pulses of said first and second filament currents or the quantity of filament current as a function of said control state.

2. An electron shower apparatus for irradiating a sample with thermoelectrons from first and second filaments respectively, comprising:

first filament current control means for controlling the quantity of filament current for use in heating said first filament; and second filament current control means for controlling the quantity of filament current for use in heating said second filament, said first and second filament current control means decreasing or eliminating magnetic fields generated by said first and second filaments respectively, at least one of said first and second filament current control means performing control to irradiate said sample constantly with said thermoelectrons; further comprising:

first electron shower current control means for controlling the quantity of first electron shower current which is irradiation of said thermoelectrons generated from said first filament; and second electron shower current control means for controlling the quantity of second electron shower current which is irradiation of said thermoelectrons generated from said second filament, said first and second electron shower current control means controlling the quantity of synthetic electron shower current to a constant level, said synthetic electron shower current being obtained by synthesizing said first and second electron shower currents.

3. An electron shower apparatus for irradiating a sample with thermoelectrons from a filament, comprising:

thermoelectron extracting means for extracting said thermoelectrons from said filament to irradiate said sample;

filament current control means for controlling said filament current in quantity for use in heating said filament; and reverse current supply means for supplying a reverse current at a longer distance from said thermoelectron extracting means than said filament current, said reverse current being larger than said filament current in quantity and having a direction opposite to said filament current, said reverse current supply means operating to decrease or eliminate a magnetic field generated by said filament.

4. The electron shower apparatus of claim 3, wherein said reverse current supply means includes:

reverse current passing means provided at a longer distance from said thermoelectron extracting means than said filament for passing said reverse current; and reverse current passing means current control means for controlling the quantity of reverse current passing means current which is said reverse current passing through said reverse current passing means.

5. The electron shower apparatus of claim 4 further comprising control state measuring means for measuring a control state which is the quantity of electron shower current or an electrification distribution of said sample.

6. An electron shower apparatus for irradiating a sample with thermoelectrons from a filament, comprising:

thermoelectron extracting means for extracting said thermoelectrons from said filament to irradiate said sample;

filament current control means for controlling said filament current in quantity for use in heating said filament;

control state measuring means for measuring a control sate which is the quantity of electron shower current or an electrification distribution of said sample; and reverse current supply means for supplying a reverse current at a longer distance from said thermoelectron extracting means than said filament current, said reverse current being larger than said filament current and having a direction opposite to said filament current, said reverse current supply means operating to decrease or eliminate a magnetic field generated by said filament, said reverse current supply means including:

reverse current passing means provided at a longer distance from said thermoelectron extracting means than said filament for passing said reverse current; and reverse current passing means current control means for controlling the quantity of reverse current passing means current which is said reverse current passing through said reverse current passing means, said reverse current passing means current control means controlling said reverse current passing means current in quantity as a function of said control state.

7. An electron shower apparatus for irradiating a sample with thermoelectrons from a filament, comprising:

thermoelectron extracting means for extracting said thermoelectrons from said filament to irradiate said sample;

filament current control means for controlling said filament current in quantity for use in heating said filament;

control state measuring means for measuring a control sate which is the quantity of electron shower current or an electrification distribution of said sample; and reverse current supply means for supplying a reverse current at a longer distance from said thermoelectron extracting means than said filament current, said reverse current being larger than said filament current and having a direction opposite to said filament current, said reverse current supply means operating to decrease or eliminate a magnetic field generated by said filament, said reverse current supply means including:

reverse current passing means provided at a longer distance from said thermoelectron extracting means than said filament for passing said reverse current; and reverse current passing means current control means for controlling the quantity of reverse current passing means current which is said reverse current passing through said reverse current passing means, said reverse current passing means current control means being divided into a plurality of unattached parts, and controlling said reverse current passing means current to vary a magnitude of a magnetic field generated by said reverse current in each part of said reverse current passing means to control an electron shower distribution.

8. The electron shower apparatus of claim 7, wherein said reverse current passing means current control means controls said electron shower distribution as a function of said electrification distribution of said sample.

9. The electron shower apparatus of claim 5, wherein said electrification distribution of said sample includes a correlation between a current density distribution of an ion beam charging said sample and said electron shower distribution.

10. An electron shower apparatus for irradiating a sample with thermoelectrons from a filament, comprising:

thermoelectron extracting means for extracting said thermoelectrons from said filament to irradiate said sample;

filament current control means for controlling said filament current in quantity for use in heating said filament;

control state measuring means for measuring a control state which is the quantity of electron shower current or an electrification distribution of said sample, said electrification distribution of said sample including a correlation between a current density distribution of an ion beam charging said sample and said electron shower distribution;

electron shower irradiation position control means for controlling an electron shower irradiation position, said electron shower irradiation position control means controlling said electron shower irradiation position as a function of said electrification distribution of said sample; and reverse current supply means for supplying a reverse current at a longer distance from said thermoelectron extracting means than said filament current, said reverse current being larger than said filament current and having a direction opposite to said filament current, said reverse current supply means operating to decrease or eliminate a magnetic field generated by said filament, said reverse current supply means including:

reverse current passing means provided at a longer distance from said thermoelectron extracting means than said filament for passing said reverse current; and reverse current passing means current control means for controlling the quantity of reverse current passing means current which is said reverse current passing through said reverse current passing means.

* * * * *

UNITED STATES PATENT AND TRADEMARK OFFICE
CERTIFICATE OF CORRECTION

PATENT NO. : 5,329,129
DATED : July 12, 1994
INVENTOR(S) : Kazuhiro SHONO et al.

It is certified that error appears in the above-indentified patent and that said Letters Patent is hereby corrected as shown below:

Column 11, lines 35-37, change "a medium reverse current control of the implantation is carried out" to --a reverse current control is carried out during the implantation--;
Column 11, lines 38-39, change "implantion" to --implantation--.
Column 15, line 17, change "sate" to --state--.

Signed and Sealed this

Twentieth Day of December, 1994

Attest:

BRUCE LEHMAN

*Attesting Officer*      *Commissioner of Patents and Trademarks*